(12) United States Patent
Zhang (10) Patent No.: US 12,328,943 B2
(45) Date of Patent: Jun. 10, 2025

(54) ARRAY SUBSTRATE AND DISPLAY PANEL (71) Applicant: Suzhou China Star Optoelectronics Technology Co., Ltd., Jiangsu (CN)

(72) Inventor: Weiwei Zhang, Jiangsu (CN)

(73) Assignee: Suzhou China Star Optoelectronics Technology Co., Ltd., Jiangsu (CN)

( * ) Notice: Subject to any disclaimer, the term of this patent is extended or adjusted under 35 U.S.C. 154(b) by 176 days.

(21) Appl. No.: 18/077,034

(22) Filed: Dec. 7, 2022

(65) Prior Publication Data
US 2024/0072067 A1 Feb. 29, 2024

(30) Foreign Application Priority Data

Aug. 29, 2022 (CN) .......................... 202211042397.1

(51) Int. Cl.
*H10D 86/60* (2025.01)
*G02F 1/1333* (2006.01)
*G02F 1/1343* (2006.01)
*G02F 1/136* (2006.01)
*G02F 1/1362* (2006.01)
*H10D 86/40* (2025.01)

(52) U.S. Cl.
CPC ....... *H10D 86/60* (2025.01); *G02F 1/133345* (2013.01); *G02F 1/134309* (2013.01); *G02F 1/13606* (2021.01); *G02F 1/136286* (2013.01); *H10D 86/441* (2025.01)

(58) Field of Classification Search
CPC ............. G02F 1/1345; G02F 1/134318; G02F 1/136286; G02F 1/13606; G02F 1/134309; G02F 1/133345; H10D 86/441
See application file for complete search history.

(56) References Cited

U.S. PATENT DOCUMENTS

| | | | |
|---|---|---|---|
| 2004/0189917 A1 | 9/2004 | Tanaka et al. | |
| 2005/0105034 A1* | 5/2005 | Ono | G02F 1/134363 349/143 |
| 2005/0110930 A1* | 5/2005 | Kim | G02F 1/134363 349/141 |
| 2006/0001815 A1* | 1/2006 | Kim | G02F 1/134363 349/141 |

(Continued)

FOREIGN PATENT DOCUMENTS

| | | |
|---|---|---|
| CN | 1619394 A | 5/2005 |
| CN | 103163704 A | 6/2013 |

(Continued)

OTHER PUBLICATIONS

Chinese Office Action issued in corresponding Chinese Patent Application No. 202211042397.1 dated Jan. 26, 2025, pp. 1-8.

*Primary Examiner* — Jonathan Y Jung
(74) *Attorney, Agent, or Firm* — PV IP PC; Christopher S. Ruprecht; Wei Te Chung (57) ABSTRACT

An array substrate and a display panel are disclosed. The array substrate includes a substrate, a scan wiring layer, and a common electrode layer. The scan wiring layer includes a vertical scan wire. The common electrode layer includes a common electrode and a horizontal scan wire. The horizontal scan wire is spaced apart from the common electrode. An orthographic projection of the common electrode on the substrate at least partially covers an orthographic projection of the vertical scan wire on the substrate.

14 Claims, 4 Drawing Sheets (56) References Cited

U.S. PATENT DOCUMENTS

| | | | | |
|---|---|---|---|---|
| 2014/0152938 A1* | 6/2014 | Lee | ................... | G09G 3/3648 |
| | | | | 438/30 |
| 2014/0375534 A1* | 12/2014 | Lee | ................... | G09G 3/3648 |
| | | | | 345/87 |
| 2021/0318583 A1 | 10/2021 | Shin et al. | | |
| 2022/0164052 A1 | 5/2022 | Huang et al. | | |
| 2022/0382115 A1* | 12/2022 | Zhang | ............... | G02F 1/134309 |

FOREIGN PATENT DOCUMENTS

| | | |
|---|---|---|
| CN | 114114763 A | 3/2022 |
| WO | 2022047793 A1 | 3/2022 |

* cited by examiner

ARRAY SUBSTRATE AND DISPLAY PANEL

CROSS-REFERENCE TO RELATED APPLICATIONS

This application claims priority to Chinese Patent Application No. 202211042397.1 filed on Aug. 29, 2022, which is incorporated by reference herein in its entirety.

TECHNICAL FIELD

The present disclosure relates to a field of display technology, and more particularly, to an array substrate and a display panel.

BACKGROUND

With the development of a current panel product to a narrower bezel and higher resolution, an ultra-high definition liquid crystal display having an ultra-narrow bezel with a seam less than 5.5 mm, an ultra-narrow bezel with a seam less than 1 mm, or the like are developed, which brings new vitality and vigor to the panel industry. By adopting a design that a gate driver is provided in a thin film flip-chip package on a bottom or top side of the display panel in a plan view, and thus a driving signal for driving a scan wire is provided on a same side as a driving signal for driving a data wire, the widths of left and right side bezels of the liquid crystal display are reduced, and the ultra-narrow bezel is realized.

In the gate driver in the thin film flip-chip package manner, the scan wire has a line extending in a vertical direction in a pixel, and a parasitic capacitor is formed between the line of the scan wire extending in a vertical direction and the pixel. In this case, a crosstalk can occur in the display panel due to a coupling effect of the parasitic capacitor on the pixel, which affects the product quality of the display panel.

Therefore, how to reduce the line of the scan wire extending in a vertical direction and the pixel is an urgent problem to be solved in the art.

Technical Problem

The present disclosure provides an array substrate and a display panel, which can reduce the parasitic capacitor between a vertical scan wire and a pixel electrode and improve a display effect.

Technical Solution

In one embodiment of the present disclosure, an array substrate is provided. The array substrate includes a substrate; a scan wiring layer disposed on the substrate, wherein the scan wiring layer includes a vertical scan wire; and a common electrode layer disposed at a side of the scan wiring layer away from the substrate, wherein the common electrode layer includes a common electrode and a horizontal scan wire, the horizontal scan wire is spaced apart from the common electrode, and the horizontal scan wire is electrically connected to the vertical scan wire; wherein an orthographic projection of the common electrode on the substrate at least partially covers an orthographic projection of the vertical scan wire on the substrate.

Alternatively, in some embodiments of the present disclosure, the array substrate further includes a data wiring layer disposed on a side of the common electrode layer away from the substrate, and the data wiring layer includes a data signal wire.

Alternatively, in some embodiments of the present disclosure, the array substrate further includes a pixel electrode layer disposed on a side of the data wiring layer away from the substrate, the pixel electrode layer includes a pixel electrode, an orthographic projection of the pixel electrode on the substrate covers an orthographic projection of the data signal wire on the substrate, and the orthographic projection of the pixel electrode on the substrate at least partially covers the orthographic projection of the common electrode on the substrate.

Alternatively, in some embodiments of the present disclosure, the vertical scan wire is disposed between two adjacent one of the pixel electrodes.

Alternatively, in some embodiments of the present disclosure, the orthographic projection of the data signal wire on the substrate is located on a centerline of the orthographic projection of the pixel electrode on the substrate.

Alternatively, in some embodiments of the present disclosure, the orthographic projection of the common electrode on the substrate covers the orthographic projection of the vertical scan wire on the substrate.

Alternatively, in some embodiments of the present disclosure, the common electrode includes a first sub-electrode and a second sub-electrode, the first sub-electrode and the second sub-electrode are spaced apart from each other, the first sub-electrode at least partially overlaps the pixel electrode, the first sub-electrode partially overlaps the vertical scan wire, the second sub-electrode is disposed between two adjacent one of the pixel electrodes, and the second sub-electrode partially overlaps the vertical scan wire.

Alternatively, in some embodiments of the present disclosure, the number of the vertical scan wires is same as the number of the data signal wires.

Alternatively, in some embodiments of the present disclosure, the array substrate further includes a first insulation layer, a second insulation layer, and a third insulation layer, wherein the first insulation layer is disposed between the scan wiring layer and the common electrode layer, the second insulation layer is disposed between the common electrode layer and the data wiring layer, and the third insulation layer is disposed between the data wiring layer and the pixel electrode layer.

Alternatively, in some embodiments of the present disclosure, a cross-sectional width of the data signal wire is greater than a cross-sectional width of the vertical scan wire.

In another embodiment of the present disclosure, a display panel including an array substrate is provided. The array substrate includes a substrate; a scan wiring layer disposed on the substrate, wherein the scan wiring layer includes a vertical scan wire; and a common electrode layer disposed at a side of the scan wiring layer away from the substrate, wherein the common electrode layer includes a common electrode and a horizontal scan wire, the horizontal scan wire is spaced apart from the common electrode, and the horizontal scan wire is electrically connected to the vertical scan wire; wherein an orthographic projection of the common electrode on the substrate at least partially covers an orthographic projection of the vertical scan wire on the substrate.

Alternatively, in some embodiments of the present disclosure, the array substrate further includes a data wiring layer disposed on a side of the common electrode layer away from the substrate, the data wiring layer includes a data signal wire.

Alternatively, in some embodiments of the present disclosure, the array substrate further includes a pixel electrode layer disposed on a side of the data wiring layer away from the substrate, the pixel electrode layer includes a pixel electrode, an orthographic projection of the pixel electrode on the substrate covers an orthographic projection of the data signal wire on the substrate, and the orthographic projection of the pixel electrode on the substrate at least partially covers the orthographic projection of the common electrode on the substrate.

Alternatively, in some embodiments of the present disclosure, the vertical scan wire is disposed between two adjacent one of the pixel electrodes.

Alternatively, in some embodiments of the present disclosure, the orthographic projection of the data signal wire on the substrate is located on a centerline of the orthographic projection of the pixel electrode on the substrate.

Alternatively, in some embodiments of the present disclosure, the orthographic projection of the common electrode on the substrate covers the orthographic projection of the vertical scan wire on the substrate.

Alternatively, in some embodiments of the present disclosure, the common electrode includes a first sub-electrode and a second sub-electrode, the first sub-electrode and the second sub-electrode are spaced apart from each other, the first sub-electrode at least partially overlaps the pixel electrode, the first sub-electrode partially overlaps the vertical scan wire, the second sub-electrode is disposed between two adjacent one of the pixel electrodes, and the second sub-electrode partially overlaps the vertical scan wire.

Alternatively, in some embodiments of the present disclosure, the number of the vertical scan wires is same as the number of the data signal wires.

Alternatively, in some embodiments of the present disclosure, the array substrate further includes a first insulation layer, a second insulation layer, and a third insulation layer, wherein the first insulation layer is disposed between the scan wiring layer and the common electrode layer, the second insulation layer is disposed between the common electrode layer and the data wiring layer, and the third insulation layer is disposed between the data wiring layer and the pixel electrode layer.

Alternatively, in some embodiments of the present disclosure, a cross-sectional width of the data signal wire is greater than a cross-sectional width of the vertical scan wire.

Beneficial Effect

In an embodiment of the present disclosure, an array substrate is provided. The array substrate includes the substrate, the scan wiring layer, and the common electrode layer. The scan wiring layer including the vertical scan wire is disposed on the substrate. The common electrode layer including the common electrode and the horizontal scan wire is disposed on the side of the scan wiring layer away from the substrate. The horizontal scan wire is spaced apart from the common electrode, and the horizontal scan wire is electrically connected to the vertical scan wire. The orthographic projection of the common electrode on the substrate at least partially covers the orthographic projection of the vertical scan wire on the substrate. The array substrate in an embodiment of the present disclosure can reduce the parasitic capacitance between the vertical scan wire and the pixel electrode, improve the coupling effect of the parasitic capacitor to respective pixels, reduce the risk of crosstalk, and improve the display effect.

BRIEF DESCRIPTION OF THE DRAWINGS

In order for more clearly describing technical solutions in embodiments of the present disclosure, brief description will be given below with reference to the accompanying drawings which are illustrated for describing the embodiments. The accompanying drawings in the following description merely illustrate some embodiments of the present disclosure. For those skilled in the art, other drawings may be obtained from these drawings without creative effort.

DESCRIPTION OF SPECIFIC EMBODIMENTS OF THE INVENTION

Technical solutions in embodiments of the present disclosure will be clearly and completely described with reference to the accompanying drawings in the embodiments of the present disclosure. It will be apparent that the described embodiments are only part of the embodiments of the present disclosure, and not all of the embodiments. Based on the embodiments in the present disclosure, all other embodiments obtained by a person skilled in the art without involving any inventive effort are within the scope of the present disclosure.

Embodiments of the present disclosure provide an array substrate and a display panel, which can reduce parasitic capacitor between a vertical scan wire and a pixel electrode and improve a display effect. Detailed descriptions are given below. It should be noted that the order in which the following embodiments are described is not intended to limit the preferred order of the embodiments. Additionally, in the description herein, the term "comprising/including" means "comprising/including, but not limited to." The terms "first," "second," "third," or the like are used merely as labels, to distinguish between different objects and not to describe a particular order.

Figure 1:
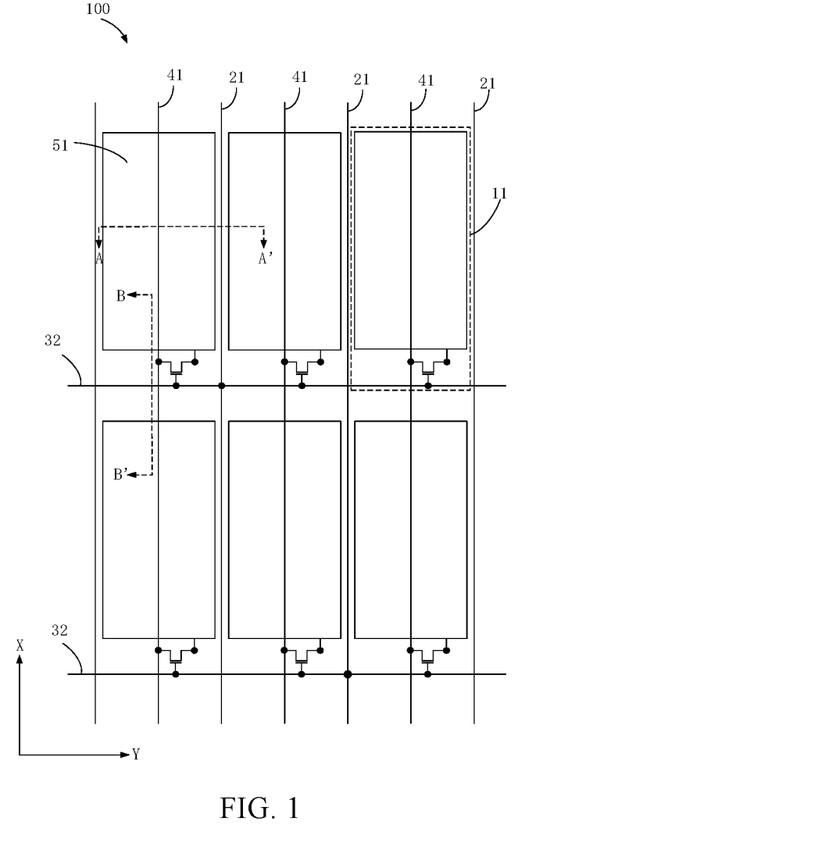
FIG. 1 is a schematic view of a pixel array structure of an array substrate according to an embodiment of the present disclosure.
Figure 2:
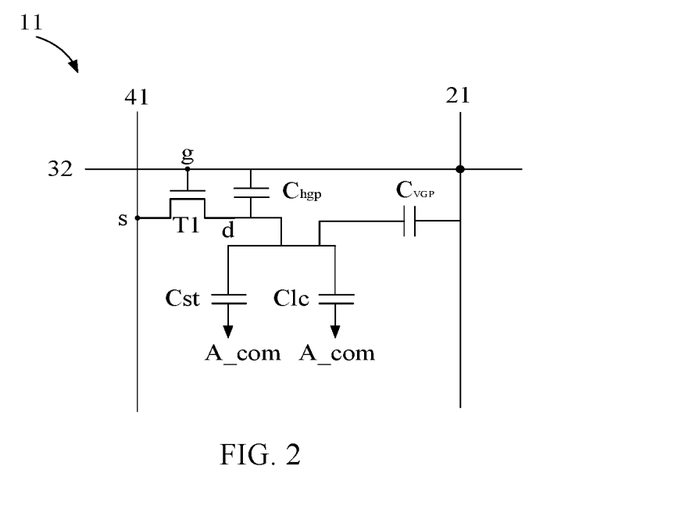
FIG. 2 is an equivalent circuit diagram of a pixel unit 11 of FIG. 1.
Figure 3:
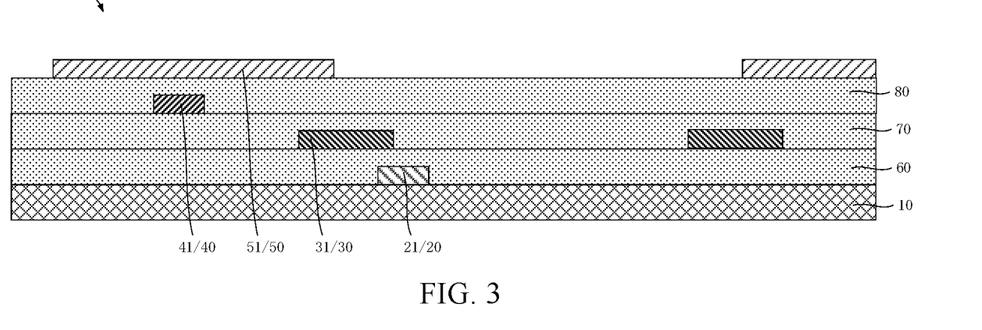
FIG. 3 is a cross-sectional view of an array substrate of FIG. 1 taken along line AA'.
Figure 4:
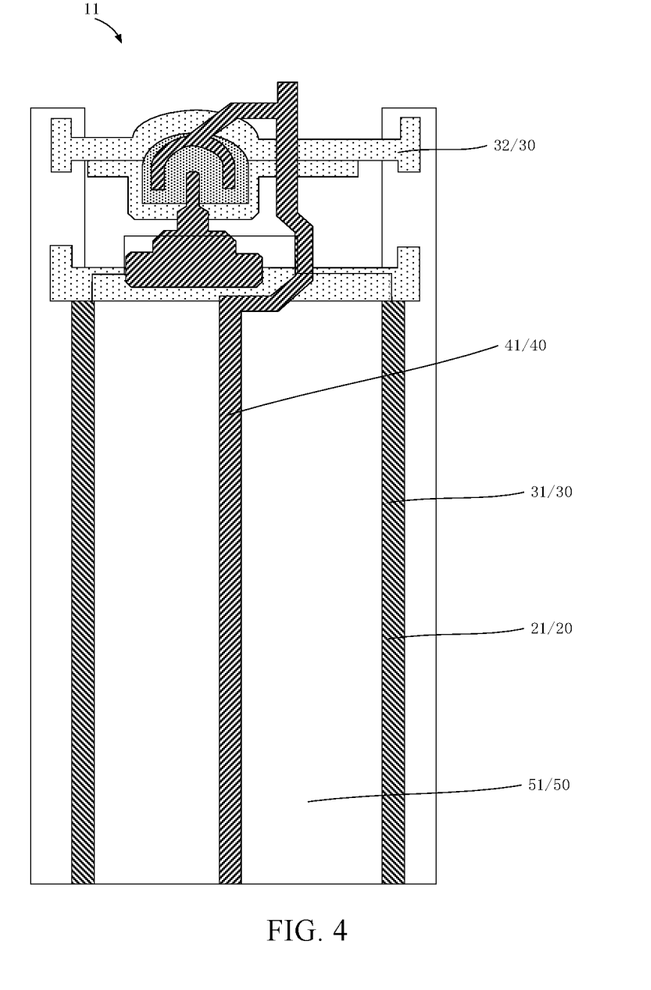
FIG. 4 is a schematic top view of a pixel unit 11 of FIG. 1.
Figure 5:
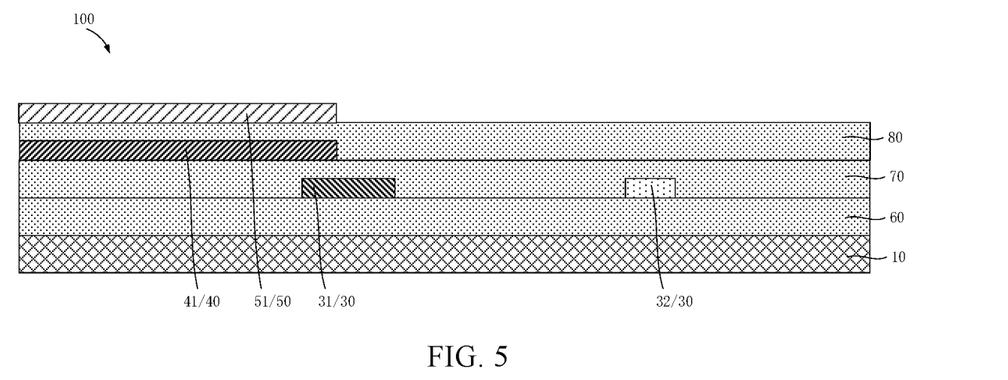
FIG. 5 is a cross-sectional view of an array substrate of FIG. 1 taken along line BB'.

Referring to FIGS. 1 to 5, FIG. 1 is a schematic view of a pixel array structure of an array substrate according to an embodiment of the present disclosure; FIG. 2 is an equivalent circuit diagram of a pixel unit 11 in FIG. 1; FIG. 3 is a cross-sectional view of an array substrate of FIG. 1 taken along line AA'; FIG. 4 is a schematic top view of a pixel unit 11 of FIG. 1; and FIG. 5 is a cross-sectional view of an array substrate of FIG. 1 taken along line BB'. As shown in FIGS. 1 to 5, an embodiment of the present disclosure provides an array substrate 100. The array substrate 100 includes a substrate 10, a scan wiring layer 20, and a common electrode layer 30. The scan wiring layer 20 including a vertical scan wire 21 is disposed on the substrate 10. The common electrode layer 30 includes a common electrode 31 and a horizontal scan wire 32 and is disposed on a side of the scan wiring layer 20 away from the substrate 10. The horizontal scan wire 32 is spaced apart from the common electrode 31, and the horizontal scan wire 32 is electrically connected to the vertical scan wire 21. An orthographic projection of the common electrode 31 on the substrate 10 at least partially covers an orthographic projection of the vertical scan wire 21 on the substrate 10.

In the array substrate 100 according to an embodiment of the present disclosure, the scan wiring layer 20 and the common electrode layer 30 are provided so that the orthographic projection of the common electrode 31 of the common electrode layer 30 on the substrate 10 may at least partially cover the orthographic projection of the vertical scan wire 21 of the scan wiring layer 20 on the substrate 10. Therefore, a parasitic capacitance can be reduced, crosstalk caused by the parasitic capacitance can be avoided, and the display effect can be improved.

In an embodiment of the present disclosure, as shown in FIGS. 1 and 2, the array substrate 100 includes a plurality of pixel units 11 arranged in an array, the vertical scan wires 21, the horizontal scan wires 32, and data signal wires 41. Each of the pixel units 11 includes a pixel electrode 51 and a switching transistor T1. Each of the vertical scan wires 21 is located between adjacent columns of the pixel unit array arranged in a width direction Y of the array substrate, and extends along a length direction X of the array substrate. Each of the horizontal scan wires 32 is located between adjacent rows of the pixel unit array arranged in the length direction X of the array substrate, and extends along the width direction Y of the array substrate. The data signal wires 41 are respectively located on columns of the pixel unit array arranged in the width direction Y of the array substrate, and extend along the length direction X of the array substrate. Any one of the vertical scan wires 21 is electrically connected to at least one horizontal scan wire 32. For example, any one of the vertical scan wires 21 may be electrically connected to one horizontal scan wire 32, two horizontal scan wires 32, three horizontal scan wires 32, and . . . n horizontal scan wires 32. In FIG. 1, the vertical scan wire 21 is electrically connected to only one horizontal scan wire 32. A person skilled in the art may make adjustments as required, and the present disclosure is not specifically limited herein. A source s of the switching transistor T1 is electrically connected to the data signal wire 41, a gate g of the switching transistor T1 is electrically connected to the horizontal scan wire 32, and a drain d of the switching transistor T1 is electrically connected to the pixel electrode 51. The switching transistors T1 in the pixels in the same column of the pixel unit array may be located on one side of the same data signal wire 41, or may be located on opposite sides of said data signal wire 41.

As shown in FIG. 2, in the driving process of the array substrate 100, a scan signal is transmitted to the horizontal scan wire 32 through the vertical scan wire 21, and then is transferred to the gate g of the switching transistor T1, so that the switching transistor T1 is turned on. A data signal is transferred to the source s of the switching transistor T1 via the data signal wire 41. A liquid crystal capacitor Clc includes the pixel electrode 51 disposed on the array substrate 100 and the common electrode 31, that is, A-COM, disposed on a color film substrate (not shown). A storage capacitor Cst includes the pixel electrode 51 and the common electrode 31 disposed on the array substrate 100. A parasitic capacitor $C_{vgp}$ includes the vertical scan wire 21 and the pixel electrode 51. A parasitic capacitor $C_{hgp}$ includes the horizontal scan wire 32 and the pixel electrode 51. When the switching transistor T1 is turned on in response to the scan signal, the data signal is transferred to the pixel electrode 51 of the liquid crystal capacitor Clc via the drain d of the switching transistor T1. When a voltage applied to the liquid crystal capacitors Clc is changed, orientation directions of liquid crystal molecules in a liquid crystal layer (not shown) are also changed. The light transmittance of the pixel units 11 is changed, and the display brightness of each of the pixel units 11 is changed. Under the condition that the parasitic capacitance between the pixel electrode 51 and the vertical scan wire 21 is larger, a pixel voltage of the pixel electrode 51 can be subject to greater interference due to the change of the signal transmitted through the vertical scan wire 21. In the present disclosure, the vertical scan wire 21 is covered by the common electrode layer 30 to shield the pixel electrode 51 from the interference the vertical scan wire 21, thereby reducing the parasitic capacitance between the vertical scan wire 21 and the pixel electrode 51, avoiding crosstalk caused by the parasitic capacitance between the vertical scan wire 21 and the pixel electrode 51, and improving the display effect.

In an embodiment of the present disclosure, as shown in FIG. 3, the array substrate further includes a data wiring layer 40 disposed on a side of the common electrode layer 30 away from the substrate 10. The data wiring layer 40 includes data signal wires 41. The data signal wires 41 provide the data signals to the pixel units 11.

In an embodiment of the present disclosure, preferably, a cross-sectional width of the data signal wire 41 is larger than that of the vertical scan wire 21, which advantageously reduces the impedance on the data signal wire 41, thereby reducing the loss of the data signal transmitted through the data signal wire 41 during transmission and improving the display image quality. The cross-sectional width refers to a length along the width direction X of the array substrate.

As shown in FIG. 3, the common electrode 31 partially covers the vertical scan wire 21. Therefore, an electric field between the vertical scan wire 21 and the pixel unit 11 by the common electrode 31 can be avoided. The parasitic capacitance between the vertical scan wire 21 and the pixel unit 11 can be greatly reduced. The influence on the pixel voltage of the pixel unit 11 when the signal transmitted through the vertical scan wire 21 is changed can be significantly reduced or no longer affected. The difference between the pixel voltage of the pixel unit 11 at a position where the vertical scan wire 21 is connected to the horizontal scan wire 32 and the pixel voltage of the pixel unit 11 at the other position can be greatly reduced. The display abnormality of the display screen can be improved or eliminated.

In an embodiment of the present disclosure, as shown in FIG. 3, the array substrate further includes a pixel electrode layer 50 disposed on a side of the data wiring layer 40 away from the substrate 10. The pixel electrode layer 50 includes the pixel electrode 51. An orthographic projection of the pixel electrode 51 on the substrate 10 covers an orthographic projection of the data signal wire 41 on the substrate 10, and the orthographic projection of the pixel electrode 51 on the substrate 10 at least partially covers the orthographic projection of the common electrode 31 on the substrate 10. It should be noted that the data wiring layer 40 may also be disposed on a side of the pixel electrode layer 50 away from the substrate 10. The pixel electrode 51 may be adjusted as required by a person skilled in the art, and the present disclosure is not specifically limited herein.

In an embodiment of the present disclosure, the vertical scan wire 21 is disposed between two adjacent ones of the pixel electrodes 51. Therefore, a distance between the vertical scan wire 21 and the data signal wire 41 can be advantageously increased. The parasitic capacitance between the data signal wire 41 and the vertical scan wire 21 can be reduced. Meanwhile, an overlapping area of the vertical scan wire 21 and the pixel electrode 51 can be reduced, and the parasitic capacitance between the vertical scan wire 21 and the pixel electrode 51 can be reduced. Further it is advantageous for the common electrode 31 to cover and shield the vertical scan wire 21, and thus the parasitic capacitance between the vertical scan wire 21 and the pixel electrode 51 can be reduced, and the display effect can be improved.

In an embodiment of the present disclosure, the common electrode 31 and the pixel electrode 51 are stacked, and the cross-sectional width of the common electrode 31 in the length direction X of the array substrate may be larger than the cross-sectional width of the pixel electrode 51 in the length direction X of the array substrate, which facilitates shielding the vertical scan wires 21.

In an embodiment of the present disclosure, the data signal wire 41 extends along the length direction X of the array substrate. The orthographic projection of the data signal wire 41 on the substrate 10 overlaps with that of the pixel electrode 51. Preferably, as shown in FIG. 4, the orthographic projection of the data signal wire 41 on the substrate 10 is located at a centerline of the orthographic projection of the pixel electrode 51 on the substrate 10. In an embodiment of the present disclosure, the data signal wire 41 is located at a trunk region of the pixel electrode 51. In this case, a spacing between the data signal wires 41 and the vertical scan wires 21 is maximized, and a spacing between two adjacent ones of the data signal wires 41 is maximized, so that the interference to the pixel voltage of the pixel electrode 51 is minimized when the signal transmitted through the vertical scan wires 21 is changed, thereby improving the stability of the pixel voltage. In the meantime, it avoids a problem in the art in which both the data signal wire 41 and the vertical scan wire 21 are disposed between two adjacent ones of the pixel electrodes 51. The parasitic capacitance between the data signal wire 41 and the pixel electrode 51 at the left side of the data signal wire 41 is the same as the parasitic capacitance between the data signal wire 41 and the pixel electrode 51 at the right side of the data signal wire 41. That is, with respect to the pixel voltages of the pixel electrodes 51 at the left and right sides of the data signal wire 41, the data signal wire 41 has the substantially same effect. Therefore, in the embodiment of the present disclosure, a problem in the art can be avoid that the data signal wire 41 has different effects on the pixel voltages of the pixel electrodes 51 at the left and right sides of the data signal wire 41, due to the different distances between the data signal wire 41 and the pixel electrodes 51 at the left and right sides. Further, crosstalk difference between the data signal wire 41 and the pixel electrodes 51 at the left and right sides can be avoid. The display quality can be improved. In addition, the data signal wire 41 is disposed at the trunk region of the pixel electrode 51. The number of the signal lines disposed between adjacent ones of the pixel electrodes 51 can be reduced. The aperture ratio can be increased.

In an embodiment of the present disclosure, as shown in FIG. 5, the common electrode layer 30 includes the common electrode 31 and the horizontal scan wire 32. The horizontal scan wire 32 is disposed spaced apart from the common electrode 31, and the horizontal scan wire 32 is electrically connected to the vertical scan wire 21. In an embodiment of the present disclosure, the horizontal scan wire 32 is electrically connected to the vertical scan wire 21 through a via hole. The horizontal scan wire 32 and the common electrode 31 are disposed spaced apart from each other, to avoid the interference between signals due to the overlapping of the signal lines. The display effect is improved.

In an embodiment of the present disclosure, the array substrate 100 further includes a first insulation layer 60 disposed between the scan wiring layer 20 and the common electrode layer 30, a second insulation layer 70 disposed between the common electrode layer 30 and the data wiring layer 40, and a third insulation layer 80 disposed between the data wiring layer 40 and the pixel electrode layer 50. In an embodiment of the present disclosure, a material of the first insulation layer 60, a material of the second insulation layer 70, or a material of the third insulation layer 80 may be an organic resin material or an inorganic insulating material, for example, at least one of silicon oxide, silicon nitride, and a combination thereof, or may also be a material having a low dielectric constant. The first insulation layer 60, the second insulation layer 70, and the third insulation layer 80 include the material having a low dielectric constant and have the relatively larger thickness. In this case, the parasitic capacitances of the parasitic capacitor $C_{hgp}$ between the horizontal scan wire 32 and the pixel electrode 51, the parasitic capacitor between the data signal wire 41 and the pixel electrode 51, and the parasitic capacitor $C_{vgp}$ between the vertical scan wire 21 and the pixel electrode 51 are all greatly reduced. Meanwhile, because the dielectric constant of the organic resin material or the like is smaller, the parasitic capacitances can be further reduced. The display effect can be improved.

Figure 6:
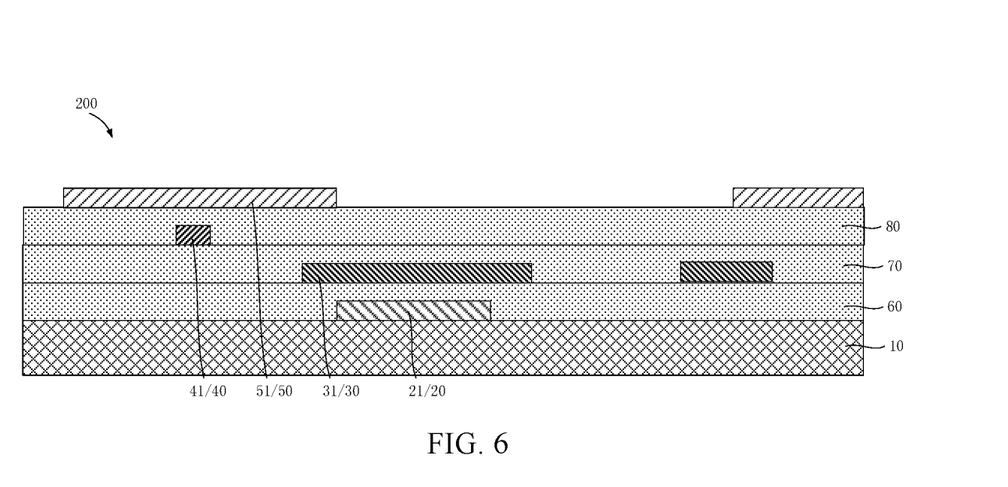
FIG. 6 is another cross-sectional view of an array substrate of FIG. 1 taken along line AA'.

As a specific embodiment of the present disclosure, reference is made to FIG. 6, which is another cross-sectional view of an array substrate of FIG. 1 taken along line AA'. As shown in FIGS. 5 and 6, in the embodiment of the present disclosure, an array substrate 200 is provided. The array substrate 200 differs from the array substrate 100 in that the orthographic projection of the common electrode 31 on the substrate 10 covers or overlaps the orthographic projection of the vertical scan wire 21 on the substrate 10.

In an embodiment of the present disclosure, the array substrate 200 includes the substrate 10, the scan wiring layer 20, the first insulation layer 60, the common electrode layer 30, the second insulation layer 70, the data wiring layer 40, the third insulation layer 80, and the pixel electrode layer 50.

The scan wiring layer 20 is disposed on the substrate 10, and the scan wiring layer 20 includes a vertical scan wire 21. The first insulation layer 60 is disposed between the scan wiring layer 20 and the common electrode layer 30.

The common electrode layer 30 is disposed on the side of the scan wiring layer 20 away from the substrate 10. The common electrode layer 30 includes the common electrode 31 and the horizontal scan wire 32. The horizontal scan wire 32 is disposed spaced apart from the common electrode 31. The horizontal scan wire 32 is electrically connected to the vertical scan wire 21. The orthographic projection of the common electrode 31 on the substrate 10 covers or overlaps the orthographic projection of the vertical scan wire 21 on the substrate 10. The second insulation layer 70 is disposed between the common electrode layer 30 and the data wiring layer 40.

The data wiring layer 40 is disposed on the side of the common electrode layer 30 away from the substrate 10. The data wiring layer 40 includes the data signal wire 41. The third insulation layer 80 is disposed between the data wiring layer 40 and the pixel electrode layer 50.

The pixel electrode layer 50 is disposed on the side of the data wiring layer 40 away from the substrate 10. The pixel electrode layer 50 includes the pixel electrode 51. The orthographic projection of the pixel electrode 51 on the substrate 10 covers the orthographic projection of the data signal wire 41 on the substrate 10. The orthographic projection of the pixel electrode 51 on the substrate 10 at least partially covers the orthographic projection of the common electrode 31 on the substrate 10. The vertical scan wire 21 is disposed between two adjacent ones of the pixel electrodes 51. In another embodiment of the present disclosure, the data wiring layer 40 may also be disposed on the side of the pixel electrode layer 50 away from the substrate 10. The data wiring layer 40 may be adjusted as required by a person skilled in the art, and the present disclosure is not specifically limited herein.

On the one hand, in the array substrate 200 provided in an embodiment of the present disclosure, the orthographic projection of the common electrode 31 on the substrate 10 covers or overlaps the orthographic projection of the vertical scan wire 21 on the substrate 10. Therefore, the influence of the vertical scan line 21 on the pixel voltage of the pixel electrode 51 is greatly reduced. The parasitic capacitance between the vertical scan line 21 and the pixel electrode 51 is greatly minimized. Crosstalk caused by the parasitic capacitance between the vertical scan line 21 and the pixel electrode 51 can be avoided. The display effect can be improved.

On the other hand, in the array substrate 200, the orthographic projection of the data signal wire 41 on the substrate 10 is located at the centerline of the orthographic projection of the pixel electrode 51 on the substrate 10. In an embodiment of the present disclosure, the data signal wire 41 is located at the trunk region of the pixel electrode 51. In this case, a spacing between the data signal wires 41 and the vertical scan wires 21 is maximized, and a spacing between two adjacent ones of the data signal wires 41 is maximized, so that the interference to the pixel voltage of the pixel electrode 51 is minimized when the signal transmitted through the vertical scan wires 21 is changed, thereby improving the stability of the pixel voltage. The number of the signal lines disposed between adjacent ones of the pixel electrodes 51 can be reduced. The aperture ratio can be increased.

Figure 7:
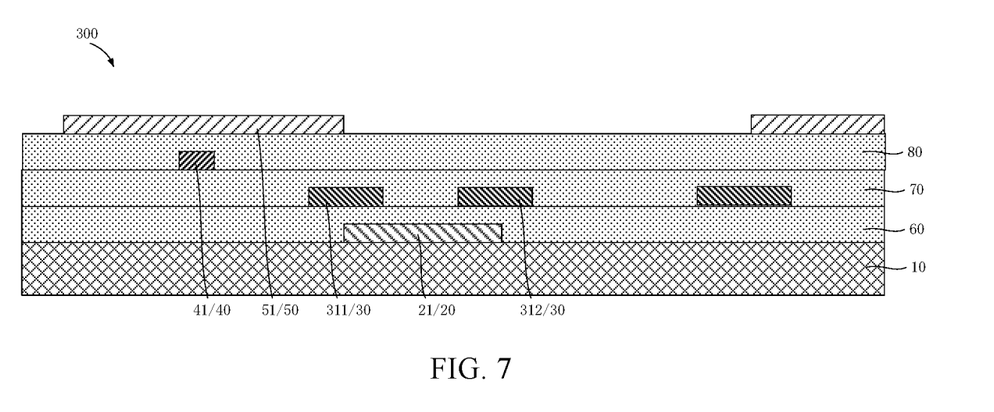
FIG. 7 is still another cross-sectional view of an array substrate of FIG. 1 taken along line AA'.

As a specific embodiment of the present disclosure, reference is made to FIG. 7, which is still another cross-sectional view of an array substrate of FIG. 1 taken along line AA'. As shown in FIGS. 5 and 7, in the embodiment of the present disclosure, an array substrate 300 is provided. The array substrate 300 differs from the array substrate 100 in that the common electrode 31 includes a first sub-electrode 311 and a second sub-electrode 312. The first sub-electrode 311 and the second sub-electrode 312 are spaced apart from each other. The first sub-electrode 311 at least partially overlaps the pixel electrode 51, and the first sub-electrode 311 further at least partially overlaps the vertical scan wire 21. The second sub-electrode 312 partially overlaps the vertical scan wire 21.

In the embodiment of the present disclosure, the array substrate 300 includes the substrate 10, the scan wiring layer 20, the first insulation layer 60, the common electrode layer 30, the second insulation layer 70, the data wiring layer 40, the third insulation layer 80, and the pixel electrode layer 50.

The scan wiring layer 20 is disposed on the substrate 10, and the scan wiring layer 20 includes a vertical scan wire 21. The first insulation layer 60 is disposed between the scan wiring layer 20 and the common electrode layer 30.

The common electrode layer 30 is disposed on the side of the scan wiring layer 20 away from the substrate 10. The common electrode layer 30 includes the common electrode 31 and the horizontal scan wire 32. The horizontal scan wire 32 is disposed spaced apart from the common electrode 31. The horizontal scan wire 32 is electrically connected to the vertical scan wire 21. The common electrode 31 includes the first sub-electrode 311 and the second sub-electrode 312. The first sub-electrode 311 is spaced from the second sub-electrode 312. The first sub-electrode 311 at least partially overlaps the pixel electrode 51, and the first sub-electrode 311 further partially overlaps the vertical scan wire 21. The second sub-electrode 312 is disposed between two adjacent ones of the pixel electrodes 51, and the second sub-electrode 312 partially overlaps the vertical scan wire 21. The second insulation layer 70 is disposed between the common electrode layer 30 and the data wiring layer 40.

The data wiring layer 40 is disposed on the side of the common electrode layer 30 away from the substrate 10. The data wiring layer 40 includes the data signal wire 41. The third insulation layer 80 is disposed between the data wiring layer 40 and the pixel electrode layer 50.

The pixel electrode layer 50 is disposed on the side of the data wiring layer 40 away from the substrate 10. The pixel electrode layer 50 includes the pixel electrode 51. The orthographic projection of the pixel electrode 51 on the substrate 10 covers the orthographic projection of the data signal wire 41 on the substrate 10. The orthographic projection of the pixel electrode 51 on the substrate 10 at least partially covers the orthographic projection of the common electrode 31 on the substrate 10. The vertical scan wire 21 is disposed between two adjacent ones of the pixel electrodes 51. In another embodiment of the present disclosure, the data wiring layer 40 may also be disposed on the side of the pixel electrode layer 50 away from the substrate 10. The data wiring layer 40 may be adjusted as required by a person skilled in the art, and the present disclosure is not specifically limited herein.

On the one hand, in the array substrate 300 provided in an embodiment of the present disclosure, the first sub-electrode 311 covers a side of the vertical scan wire 21 close to the pixel electrode 51, and the second sub-electrode 312 covers a side of the vertical scan wire 21 close to an adjacent pixel electrode 51. Therefore, the influence of the vertical scan line 21 on the pixel voltages of two adjacent pixel electrodes 51 is greatly reduced. The parasitic capacitances between the vertical scan line 21 and two adjacent pixel electrodes 51 are greatly minimized. Crosstalk caused by the parasitic capacitance between the vertical scan line 21 and two adjacent pixel electrodes 51 can be avoided. The display effect can be improved.

On the other hand, in the array substrate 300, the orthographic projection of the data signal wire 41 on the substrate 10 is located at the centerline of the orthographic projection of the pixel electrode 51 on the substrate 10. In an embodiment of the present disclosure, the data signal wire 41 is located at the trunk region of the pixel electrode 51. In this case, the spacing between the data signal wires 41 and the vertical scan wires 21 is maximized, and the spacing between two adjacent ones of the data signal wires 41 is maximized, so that the interference to the pixel voltage of the pixel electrode 51 is minimized when the signal transmitted through the vertical scan wires 21 is changed, thereby improving the stability of the pixel voltage. The number of the signal lines disposed between adjacent ones of the pixel electrodes 51 can be reduced. The aperture ratio can be increased.

Figure 8:
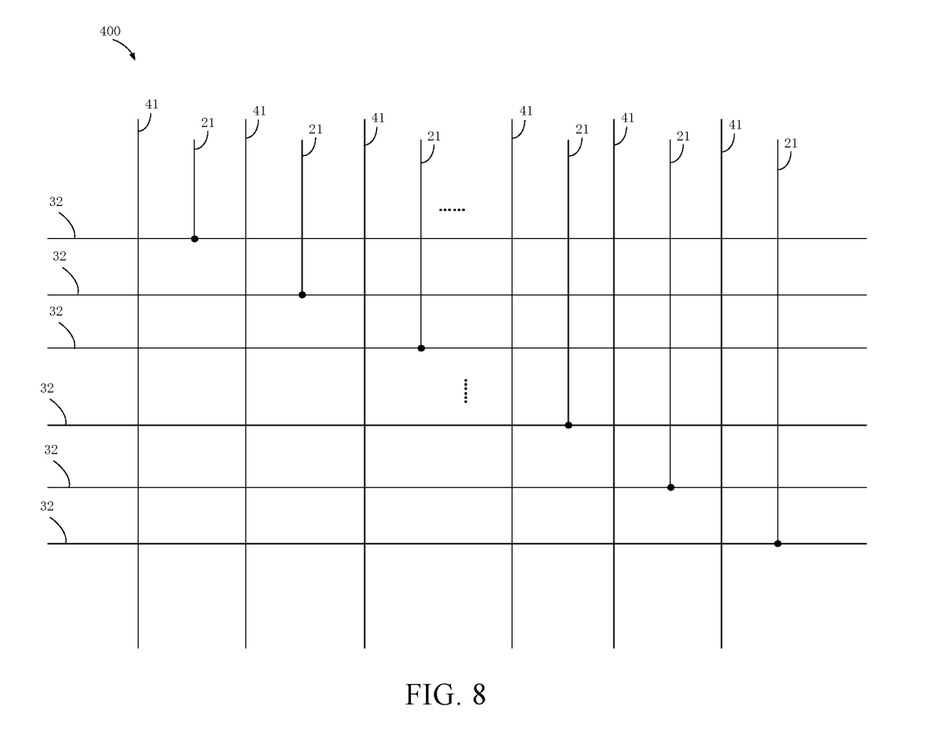
FIG. 8 is a schematic view of a connection relationship between a vertical scan wire and a horizontal scan wire in an array substrate.

As one embodiment of the present disclosure, reference is made to FIG. 8, which is a schematic view of a connection relationship between a vertical scan wire and a horizontal scan wire in an array substrate. As shown in FIG. 8, in the embodiment of the present disclosure, an array substrate 400 is provided. The array substrate 400 differs from the array substrate 100 in that the number of vertical scan wires 21 is same as the number of data signal wires 41.

In an embodiment of the present disclosure, the array substrate 400 includes a plurality of pixel units 11 arranged in an array. N columns of the pixel units 11 correspond to N data signal wires 41, and M rows of the pixel units 11 correspond to M horizontal scan wires 32. Each vertical scan wire 21 one-to-one corresponds to and is disposed adjacent with each column of the pixel units 11. The vertical scan wire 21 is electrically connected to the horizontal scan wire 32 in one-to-one correspondence. Both N and M are positive integers. Six data signal wires 41, six horizontal scan wires 32, and six vertical scan wires 21 are described in FIG. 8 as an example.

It should be noted that, in order to balance the number of signal lines between the pixel unit columns and to obtain a proper parasitic capacitance, a person skilled in the art may adjust the number of N and M according to actual requirements, and the present disclosure is not specifically limited herein.

In array substrate 400, the vertical scan wires 21 have the same number as the number of the data signal wires 41, so as to balance the number of signal lines between the pixel unit columns and to obtain a proper parasitic capacitance. In this case, the parasitic capacitance at the left side of the pixel electrode 51 is the same as the parasitic capacitance at the right side of the pixel electrode 51. The parasitic capacitance at the left side of the data signal wires 41 is the same as the parasitic capacitance at the right side of the data signal wires 41 and they just cancel each other out, while reducing the parasitic capacitance as much as possible. The coupling effect of the parasitic capacitor to the pixel units 11 can be further improved, the risk of the crosstalk caused by the parasitic capacitor between the vertical scan wires 21 and the pixel electrodes 51 can be further reduced, and the display effect.

In another aspect, an embodiment of the present disclosure provides a display panel including the array substrate described above.

In an embodiment of the present disclosure, an array substrate is provided. The array substrate includes the substrate 10, the scan wiring layer 20, and the common electrode layer 30. The scan wiring layer 20 including the vertical scan wire 21 is disposed on the substrate 10. The common electrode layer 30 including the common electrode 31 is disposed on the side of the scan wiring layer 20 away from the substrate 10. The orthographic projection of the common electrode 31 on the substrate 10 at least partially covers the orthographic projection of the vertical scan wire 21 on the substrate 10. The array substrate in an embodiment of the present disclosure can reduce the parasitic capacitance between the vertical scan wire 21 and the pixel electrode 51, improve the coupling effect of the parasitic capacitor to respective pixels, reduce the risk of crosstalk, and improve the display effect.

An array substrate and a display panel according to an embodiment of the present disclosure is described in detail above. A specific example is provided to illustrate the principles and implementations of the present disclosure. The description of the above embodiments is merely provided to help understand the method and the core idea of the present disclosure. At the same time, variations will occur to those skilled in the art in both the detailed description and the scope of the present disclosure in accordance with the teachings of the present disclosure. In summary, the present description should not be construed as limiting the present disclosure.

What is claimed is:

1. An array substrate comprising:
a substrate;
a scan wiring layer disposed on the substrate, wherein the scan wiring layer comprises a vertical scan wire;
a common electrode layer disposed at a side of the scan wiring layer away from the substrate, wherein the common electrode layer comprises a common electrode and a horizontal scan wire, the horizontal scan wire is spaced apart from the common electrode, and the horizontal scan wire is electrically connected to the vertical scan wire, wherein an orthographic projection of the common electrode on the substrate at least partially covers an orthographic projection of the vertical scan wire on the substrate;
a data wiring layer disposed on a side of the common electrode layer away from the substrate, wherein the data wiring layer comprises a data signal wire; and
a pixel electrode layer disposed on a side of the data wiring layer away from the substrate, wherein the pixel electrode layer comprises a pixel electrode, an orthographic projection of the pixel electrode on the substrate covers an orthographic projection of the data signal wire on the substrate, and the orthographic projection of the pixel electrode on the substrate at least partially covers the orthographic projection of the common electrode on the substrate,
wherein the common electrode comprises a first sub-electrode and a second sub-electrode, the first sub-electrode and the second sub-electrode are spaced apart from each other, the first sub-electrode at least partially overlaps the pixel electrode, the first sub-electrode partially overlaps the vertical scan wire, the second sub-electrode is disposed between two adjacent one of the pixel electrodes, and the second sub-electrode partially overlaps the vertical scan wire.

2. The array substrate according to claim 1, wherein the vertical scan wire is disposed between two adjacent one of the pixel electrodes.

3. The array substrate according to claim 1, wherein the orthographic projection of the data signal wire on the substrate is located on a centerline of the orthographic projection of the pixel electrode on the substrate.

4. The array substrate according to claim 1, wherein the orthographic projection of the common electrode on the substrate covers the orthographic projection of the vertical scan wire on the substrate.

5. The array substrate according to claim 1, wherein the number of the vertical scan wires is same as the number of the data signal wires.

6. The array substrate according to claim 1, wherein the array substrate further comprises a first insulation layer, a second insulation layer, and a third insulation layer, wherein the first insulation layer is disposed between the scan wiring layer and the common electrode layer, the second insulation layer is disposed between the common electrode layer and the data wiring layer, and the third insulation layer is disposed between the data wiring layer and the pixel electrode layer.

7. The array substrate according to claim 1, wherein a cross-sectional width of the data signal wire is greater than a cross-sectional width of the vertical scan wire.

8. A display panel comprising an array substrate, wherein the array substrate comprises:
  a substrate;
  a scan wiring layer disposed on the substrate, wherein the scan wiring layer comprises a vertical scan wire;
  a common electrode layer disposed at a side of the scan wiring layer away from the substrate, wherein the common electrode layer comprises a common electrode and a horizontal scan wire, the horizontal scan wire is spaced apart from the common electrode, and the horizontal scan wire is electrically connected to the vertical scan wire, wherein an orthographic projection of the common electrode on the substrate at least partially covers an orthographic projection of the vertical scan wire on the substrate;
  a data wiring layer disposed on a side of the common electrode layer away from the substrate, wherein the data wiring layer comprises a data signal wire; and
  a pixel electrode layer disposed on a side of the data wiring layer away from the substrate, wherein the pixel electrode layer comprises a pixel electrode, an orthographic projection of the pixel electrode on the substrate covers an orthographic projection of the data signal wire on the substrate, and the orthographic projection of the pixel electrode on the substrate at least partially covers the orthographic projection of the common electrode on the substrate,
  wherein the common electrode comprises a first sub-electrode and a second sub-electrode, the first sub-electrode and the second sub-electrode are spaced apart from each other, the first sub-electrode at least partially overlaps the pixel electrode, the first sub-electrode partially overlaps the vertical scan wire, the second sub-electrode is disposed between two adjacent one of the pixel electrodes, and the second sub-electrode partially overlaps the vertical scan wire.

9. The display panel according to claim 8, wherein the vertical scan wire is disposed between two adjacent one of the pixel electrodes.

10. The display panel according to claim 8, wherein the orthographic projection of the data signal wire on the substrate is located on a centerline of the orthographic projection of the pixel electrode on the substrate.

11. The display panel according to claim 8, wherein the orthographic projection of the common electrode on the substrate covers the orthographic projection of the vertical scan wire on the substrate.

12. The display panel according to claim 8, wherein the number of the vertical scan wires is same as the number of the data signal wires.

13. The display panel according to claim 8, wherein the array substrate further comprises a first insulation layer, a second insulation layer, and a third insulation layer, wherein the first insulation layer is disposed between the scan wiring layer and the common electrode layer, the second insulation layer is disposed between the common electrode layer and the data wiring layer, and the third insulation layer is disposed between the data wiring layer and the pixel electrode layer.

14. The display panel according to claim 8, wherein a cross-sectional width of the data signal wire is greater than a cross-sectional width of the vertical scan wire.

* * * * *